US010199177B2

(12) United States Patent
Herlin et al.

(10) Patent No.: US 10,199,177 B2
(45) Date of Patent: Feb. 5, 2019

(54) METHOD FOR THE SYNTHESIS OF NANOCOMPOSITES BASED ON $TiO_2$ AND CARBONATED NANOSTRUCTURES

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE DE LIMOGES, Limoges (FR)

(72) Inventors: Nathalie Herlin, Orsay (FR); Jin Wang, Linhai (CN); Mathieu Pinault, Antony (FR); Johann Boucle, Brigueuil (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE DE LIMOGES, Lomoges (FR)

( * ) Notice: Subject to any disclaimer, the term of this patent is extended or adjusted under 35 U.S.C. 154(b) by 83 days.

(21) Appl. No.: 15/325,400

(22) PCT Filed: Jul. 13, 2015

(86) PCT No.: PCT/IB2015/055289
§ 371 (c)(1),
(2) Date: Jan. 10, 2017

(87) PCT Pub. No.: WO2016/009328
PCT Pub. Date: Jan. 21, 2016

(65) Prior Publication Data
US 2017/0194104 A1 Jul. 6, 2017

(30) Foreign Application Priority Data
Jul. 15, 2014 (FR) ..................................... 14 56802

(51) Int. Cl.
B01J 37/04 (2006.01)
H01G 9/20 (2006.01)
(Continued)

(52) U.S. Cl.
CPC .......... *H01G 9/2059* (2013.01); *B01J 21/063* (2013.01); *B01J 21/185* (2013.01);
(Continued)

(58) Field of Classification Search
CPC .............. H01G 9/2059; H01L 51/4226; H01L 51/0049; B01J 21/185; B01J 21/063;
(Continued)

(56) References Cited

U.S. PATENT DOCUMENTS

2009/0239042 A1* 9/2009 Jain .................... B23K 26/0066
428/195.1
2010/0304141 A1* 12/2010 Kamegawa ............. C01B 31/02
428/402
2012/0025147 A1* 2/2012 Zhang ................ H01M 4/0421
252/503

FOREIGN PATENT DOCUMENTS

EP 2889271 A1 * 7/2015 ........... C01G 23/003

OTHER PUBLICATIONS

Alexandrescu, R., et al., "$TiO_2$ Nanosized Powders by $TiCl_4$ Laser Pyrolysis," Nanotechnology 15(5):537-545, 2004.
(Continued)

*Primary Examiner* — Waltere D. Griffin
*Assistant Examiner* — Cameron J Allen
(74) *Attorney, Agent, or Firm* — Christensen O'Connor Johnson Kindness PLLC

(57) ABSTRACT

The invention relates to a method for the synthesis of a nanocomposite compound comprising $TiO_2$ nanoparticles bound to carbon nanostructures, characterized in that it comprises the following steps: a) mixing carbon nanostructures and at least one $TiO_2$ precursor in a first liquid in order
(Continued)

to form a stock suspension; b) nebulizing said stock suspension and transporting it into a reaction chamber by means of a gaseous flow; and c) carrying out laser pyrolysis of said stock suspension in said reaction chamber in order to simultaneously form $TiO_2$ nanoparticles and graft them onto the nano structures.

9 Claims, 3 Drawing Sheets

(51) Int. Cl.
| | |
|---|---|
| B01J 37/34 | (2006.01) |
| H01L 51/00 | (2006.01) |
| H01L 51/42 | (2006.01) |
| H01L 51/44 | (2006.01) |
| C01G 23/07 | (2006.01) |
| C01G 23/08 | (2006.01) |
| B01J 21/06 | (2006.01) |
| B01J 35/00 | (2006.01) |
| B01J 21/18 | (2006.01) |
| C01B 32/168 | (2017.01) |
| C01B 32/23 | (2017.01) |

(52) U.S. Cl.
CPC ......... *B01J 35/004* (2013.01); *B01J 35/0006* (2013.01); *B01J 35/0013* (2013.01); *B01J 37/04* (2013.01); *B01J 37/349* (2013.01); *C01B 32/168* (2017.08); *C01B 32/23* (2017.08); *C01G 23/07* (2013.01); *C01G 23/08* (2013.01); *H01L 51/0021* (2013.01); *H01L 51/0045* (2013.01); *H01L 51/0049* (2013.01); *H01L 51/4226* (2013.01); *H01L 51/444* (2013.01); *C01P 2004/03* (2013.01); *C01P 2004/80* (2013.01); *Y02E 10/549* (2013.01)

(58) Field of Classification Search
CPC .. B01J 35/0006; B01J 35/0013; B01J 35/004; B01J 37/04; B01J 37/349; C01B 31/04; C01B 31/02; C23C 16/448; C23C 16/40; C23C 16/455; C01F 7/30; B82Y 40/00; B82Y 30/00
See application file for complete search history.

(56) References Cited

OTHER PUBLICATIONS

Borsella, E., et al., "Synthesis of Nanoparticles by Laser Pyrolysis: From Research to Applications," Studi & Ricerche: Review and Assessment Papaers, <http://www.afs.enea.it/project/webenea/EAI/SS-Synthesis.pdf [retrieved Dec. 29, 2016], pp. 54-64.
Cao, Q., et al., "Titania/Carbon Nanotube Composite ($TiO_2$/CNT) and Its Application for Removal of Organic Pollutants," Clean Technology Environmental Policy 15(6):871-880, Jan. 2013.
Gastro, M.R.S., et al., "Structure, Wettability and Photocatalytic Activity of $Co_2$ Laser Sintered $TiO_2$/Multi-Walled Carbon Nanotube Coatings," Nanotechnology 19:105704-1-105704-5, Feb. 2008.
Du, P., et al., "Dye-Sensitized Solar Cells Based on Anatase $TiO_2$/Multi-Walled Carbon Nanotubes Composite Nanofibers Photoanode," Electrochimica Acta 87:651-656, Jan. 2013.
Golobostanfard, M.R., and H. Abdizadeh, "Hierarchical Porous Titania/Carbon Nanotube Nanocomposite Photoanode Synthesized by Controlled Phase Separation for Dye Sensitized Solar Cell," Solar Energy Materials & Solar Cells 120 (Pt. A):295-302, Jan. 2014.
International Search Report dated Nov. 3, 2015, issued in corresponding International Application. No. PCT/IB2015/055289, filed Jul. 13, 2015, 3 pages.

* cited by examiner

METHOD FOR THE SYNTHESIS OF NANOCOMPOSITES BASED ON $TiO_2$ AND CARBONATED NANOSTRUCTURES

The invention relates to a method for synthesising nanocomposite materials, in particular composites containing carbon nanostructures such as carbon nanotubes or graphene sheets on which $TiO_2$ nanoparticles are grafted, and to the use of these composite materials. It concerns any field in which the mechanism of charge separation and extraction is crucial such as photocatalysis, photoelectrochemical systems or photovoltaic systems.

Cells with photosensitive pigment (dye or chromophore) containing $TiO_2$ (or Graetzel cells) exhibit high conversion yields (>15%) but their development on a large scale has been limited by the presence of a liquid electrolyte (problems of leakage, corrosion . . . ). To bypass this limitation, all-solid sensitized cells are currently being developed to replace the electrolyte with hole-conducting organic molecules. Said cells current display yields lower than 10% (best «certified» yield 6%). In these systems, the chief factors limiting improvement in yields are the separation and collection of charges after generation of the electron-hole pair. Several approaches are used to improve the yield of these cells, for example by improving absorption or working the materials to reduce losses via recombination.

In most «conventional» approaches, extensive chemical work is conducted to optimise the chemical formulation of the dye. The objective is then to adapt the energy levels of the light-absorbing dye to those of the charge carriers, thereby limiting losses. One strategy is to develop hybrid materials containing carbon nanotubes (CNTs). The idea here is to draw benefit from the conducting properties of CNTs, generally functionalised by chromophores or coupled to nanoparticles or polymers, to improve charge separation and transfer. Several publications have investigated the potentialities of $TiO_2$/CNT architectures and have shown a distinct improvement in the yields of photocatalysis or photo-electrocatalysis with these composite architectures. The authors suggest that the improvement in yields is related to the reduction in recombination rates of electron-hole pairs due to the improved separation of charges in the presence of CNTs. Aside from the advantage for photocatalysis, this architecture therefore also has strong potentialities for producing photovoltaic cells with improved yield. In this respect, a similar approach showed a distinct improvement in performance of +30% for the generation of photocurrent (Incident Photo Current Efficiency 70%) when comparing a structure incorporating graphene nanosheets/dye/nanoparticles with a dye/nanoparticle structure. Within this context, the association of nanoparticles and carbonated nanostructures is an essential point.

The invention proposes an original, efficient method to assemble $TiO_2$ nanoparticles, these being a basic element of the porous layer of the photosensitive system, with carbon nanotubes or any other carbonated structure. The composites produced by this method exhibit a definite advantage compared with those obtained using a conventional chemical grafting method, both for photovoltaics and for photocatalysis.

Throughout this text the terms used have the following meanings:

Nanoparticles: solid particles of nanometric size;
Carbon nanostructures: carbon structures of nanometric size e.g. any type of carbon nanotube (CNT) irrespective of preparation method. They may be single walled nanotubes (SWNT), multiwalled nanotubes (MWNT) or a mixture of SWNT nanotubes and MWNT nanotubes, these nanotubes possibly being doped—e.g. with nitrogen—or non-doped; they may also be sheets of graphene whether or not oxidised;
Nanocomposite: a body composed of a carbon nanostructure on which nanoparticles are grafted; in this text, only nanocomposites comprising $TiO_2$ nanoparticles are envisaged;
Nano-objects: a mixture of nanoparticles and nanocomposites.

DESCRIPTION OF THE DRAWINGS

FIG. 3a corresponding to nanocomposites obtained without prior treatment of the CNT suspension via acid attack, and FIG. 3b corresponding to nanocomposites obtained with prior acid treatment.

PRIOR ART

To improve the charge transfer between CNTs and $TiO_2$, the prior art proposes two approaches: either starting with the two different species that are assembled together, called the ex situ approach, or by growing $TiO_2$ nanoparticles directly on the surface of CNTs.

Figure 1:
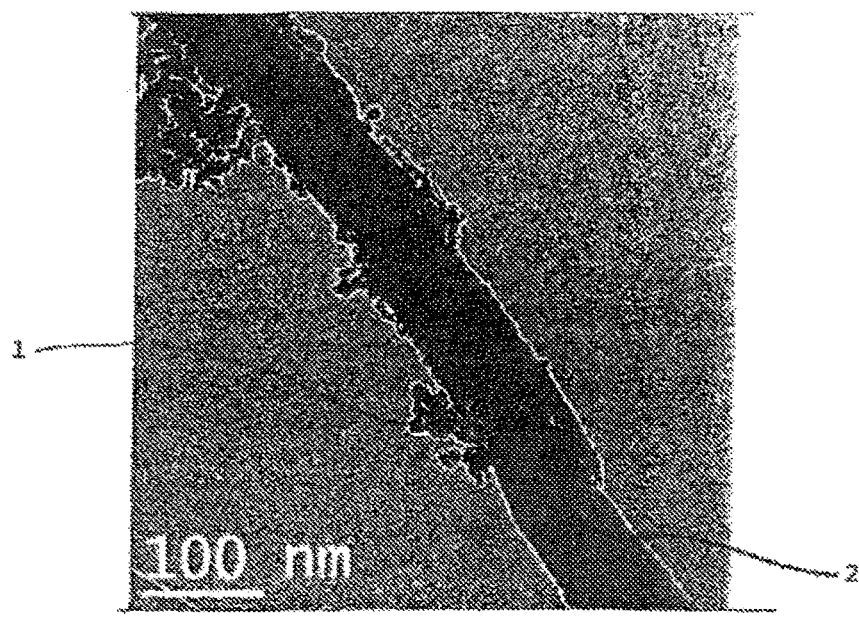
FIG. 1 is an image of an exemplary ex situ sample.

In the ex situ approach, the previously formed two species are assembled together. In the most developed method, first the surface of the CNTs is subjected to chemical attack to create defects and create bonds of —COO— type on the surface. The nanoparticles are then contacted with these CNTs in a suspension and cling onto the surface of the nanotubes at these sites. FIG. 1 is a photo illustrating the result obtained, called the Ex situ sample below. As can be seen in this Figure, very few $TiO_2$ nanoparticles 1 are grafted onto the nanotube 2.

The prior art also describes a method comprising the assembling of these species via simultaneous providing thereof (nanotubes and $TiO_2$ nanoparticles) in a reaction e.g. a combustion zone (US 2012/0107683, Kim et al.). With this method, assembly appears to be efficient and improved charge transfer properties are obtained; however, this requires prior synthesis of the two species.

Another known route is the growth of nanoparticles directly on the surface of the CNTs. One method allowing this type of synthesis is the so-called sol-gel route (Z. Li et al., Carbon nanotube/titanium dioxide (CNT/$TiO_2$) core-shell nanocomposites with tailored shell thickness, CNT content and photocatalytic/photoelectrocatalytic properties, Applied Catalysis B: Environmental, Volume 110, 2 Nov. 2011, Pages 50-57). In this case, the nanotubes are well coated and the performance of the composites are of interest compared with nanoparticles alone. As a preliminary step before $TiO_2$ synthesis, the CNTs must undergo chemical attack; synthesis therefore necessitates a waiting time and several steps. Contrary to the combustion methods mentioned above, this is a batch synthesis method.

DESCRIPTION OF THE INVENTION

To improve charge transfer using a composite of $TiO_2$ nanoparticles/carbon nanostructures, the invention proposes a method to synthesise a nanocomposite compound comprising $TiO_2$ nanoparticles attached onto carbon nanostructures, comprising the following steps.
- a) In a first liquid to form a stock suspension, mixing carbon nanostructures with at least one $TiO_2$ precursor;
- b) Nebulising and conveying said stock suspension via gaseous flow into a reaction chamber;
- c) Performing laser pyrolysis of said stock suspension in said reaction chamber so as simultaneously to form $TiO_2$ nanoparticles and to graft these onto nanostructures.

The general idea of the invention is to synthesise the $TiO_2$ nanoparticles directly on the surface of the carbon nanostructures, this additionally allowing continuous production that is therefore more easily transposable to industrial application than a technique of «batch production» type.

The synthesis of the nanocomposite is based on the growth of $TiO_2$ on the carbonated product when it passes through a laser beam, this in situ growth ensuring robust attaching of the $TiO_2$ nanoparticles onto the carbonated surface. The laser pyrolysis reaction between the carbonated nanostructures and the precursor of the nanoparticles takes place in an enclosure called a reaction chamber.

The method comprises a step consisting of mixing carbon nanostructures and a $TiO_2$ precursor in a first liquid to obtain a homogeneous suspension of nanostructures in the precursor, then to pass this mixture, preferably in droplet form, through a $CO_2$ laser beam to allow growth of the $TiO_2$ nanoparticles.

The liquids that can be used are those in which carbon nanostructures can be dispersed and which do not spontaneously react with the $TiO_2$ precursor. If this precursor is titanium tetraisopropoxide (TTIP), a suitable liquid for example is toluene, xylene, alcohol, acetone . . . .

Other $TiO_2$ precursors such as titanium tetrachloride or titanium alkoxides, in particular titanium ethoxide, titanium isopropoxide, titanium butoxide are covered by the invention.

In manner known per se in the prior art, the first liquid and the $TiO_2$ precursor must be compatible to avoid any reaction between this liquid and the precursor.

Persons skilled in the art know different techniques allowing the preparation of carbonated nanostructures, in particular carbon nanotubes. As examples, mention can be made of physical methods based on sublimation of carbon such as electric arc, laser ablation methods or using a solar oven, and chemical methods whereby carbonated sources are pyrolyzed on metal catalysts and similar to chemical vapour deposition (CVD) such as catalytic chemical vapour deposition (CCVD), aerosol-assisted chemical vapour deposition (AACVD) described by Castro et al. (2013, «The role of hydrogen in the aerosol-assisted chemical vapor deposition process in producing thin and densely packed vertically aligned carbon nanotubes», Carbon, vol. 61, pages 585-594). Also, Hilding et al. (2003, «Dispersion of carbon nanotubes in liquids», Journal of Dispersion Science and Technology, vol. 24, pages 1-41) describe different techniques which can be used to prepare carbon nanotubes.

If the first liquid is toluene and the TiO2 precursor is TTIP, the proportions used are the following:

TTIP: 90% to 95% by weight,
CNT: 0.01% to 0.10% by weight
Toluene: 4% to 10% by weight the total forming 100% by weight.

Carbonated nanocomposites are reproducibly obtained having a high $TiO_2$ coating rate, although:
- It could be feared that the carbon nanostructures are damaged during laser pyrolysis,
- On account of its heterogeneity, the nucleation reaction of $TiO_2$ on carbon nanostructures is difficult to control; it could therefore be feared that it does not develop, or only scarcely, during laser pyrolysis and that non-grafted $TiO_2$ is almost exclusively obtained.

Advantageously, the mixing step a) can be preceded by the following steps:
Adding carbon nanostructures to a dispersion liquid to form a preparatory suspension;
Dispersing the carbon nanostructures in the preparatory suspension.

The nanostructures are added in a concentration of between 0.01% and 5% by weight, preferably between 0.5% and 1% by weight.

It is desirable to disperse the nanostructures in a preparatory solution for individualisation thereof and to allow subsequent good assembly with the $TiO_2$ particles. Different treatments well known to persons skilled in art can be used to obtain a homogeneous solution. For example, mechanical treatments by manual grinding or using beads for example, or high speed agitation, ultrasonication treatment or cryogenic treatments.

Surfactants e.g. bile salt (mixture of sodium cholate and sodium deoxycholate), gum arabic, are mostly used to promote this dispersion. They also allow stabilisation of the carbon nanostructures after mechanical treatment.

The concentration of surfactants and in particular of non-ionic and/or anionic surfactants in the aqueous solution is advantageously between 0.1% and 10% by weight and in particular between 0.2% and 5% by weight.

In manner known per se in the prior art, the selected surfactant and dispersion liquid must be compatible. Preferably, a protic dispersion liquid is selected. By «protic dispersion liquid» in the present invention is meant a liquid comprising at least one hydrogen atom able to be released in proton form. Advantageously, the protic dispersion liquid is selected from among water, acetic acid, hydroxylated solvents e.g. methanol, ethanol, low molecular weight liquid glycols such as ethylene glycol, and mixtures thereof.

By «surfactant» is meant a molecule comprising a lipophilic part (apolar) and hydrophilic part (polar). Advantageously, the surfactant is selected from among anionic surfactants, cationic surfactants, zwitterionic surfactants, amphoteric surfactants and non-ionic surfactants. The aqueous solution may comprise several surfactants belonging to one same previously listed family of surfactants (i.e. anionic, cationic, zwitterionic, amphoteric or non-ionic), or several surfactants belonging to at least two of these different families of surfactants.

Anionic surfactants are the most used for dispersion. They have a negatively charged hydrophilic part which may be a sulfate group such as sodium dodecylsulfate (SDS) and sodium dodecyl benzene sulfate (SDBS) or a carboxylate group such as sodium cholate and sodium deoxycholate.

A non-ionic surfactant does not have any charge. They exist in large number such as Triton X-100, Pluronic F127, Tween 20 and 80 or BrijS20. The latter is preferred in the invention for this category of surfactant.

Advantageously, the dispersion step may comprise or be followed by an acid attack step of the nanostructures in the preparatory suspension to modify their surface condition.

This acid attack allows modification of the surface condition of nanostructures by creating oxygenated —CO— and —COO— bonds.

Advantageously, the dispersion step or acid attack step can be followed by steps to:
  filter the nanostructures for extraction thereof from the preparatory suspension;
  add these to the first liquid.

Advantageously, at the injection step b), the stock solution can be entrained by an entraining gas flow which may comprise or consist of a sensitizing gas.

The stock suspension of nanostructures and $TiO_2$ precursor is directed to a droplet generator. The droplets are entrained towards the reaction chamber by an entraining gas flow possibly containing a mixture of a neutral gas (e.g. Ar) and a so-called sensitizing gas, or solely a sensitizing gas. The function of this sensitizing gas is to compensate for the low infra-red absorption of the $TiO_2$ precursor. However, it can also be envisaged to operate with strong laser power without sensitizing gas.

The sensitizing gas is advantageously selected from the group formed by ethylene propadiene, butadiene, acetylene, sulfur hexafluoride (SF6), alone or in combination.

The droplets are conveyed by the gas flow into the beam of a $CO_2$ laser, allowing the induced growth of $Ti_{O2}$ nanoparticles in particular on the surface of the nanostructures with the onset of a pyrolysis flame.

Advantageously, the pyrolysis step c) can be followed by the following steps:
  Dry collection of the nanocomposites produced in the reaction chamber;
  Application of heat treatment to said nanocomposites to rid these of excess carbon.

The composite then undergoes heat treatment in air to eliminate excess carbon due to the precursor and/or to decomposition of the sensitizing gas.

Figure 2:
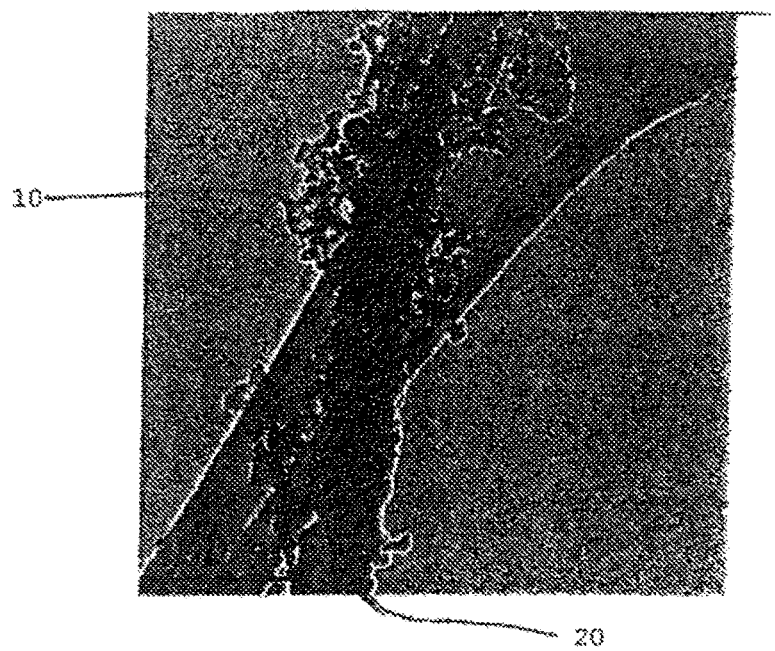
FIG. 2 is an image of an exemplary sample in accordance with embodiments described herein.

FIG. 2 is a photo illustrating the result obtained, called Sample 1. A large number of $TiO_2$ nanoparticles are grafted onto the nanotube 20.

The invention also relates to:
  a porous layer of a photovoltaic cell, comprising nanocomposites produced according to the method of the invention;
  a photovoltaic cell comprising a porous layer of the invention.

The invention also relates to use of the nanocomposites produced using the method of the invention for the photocatalysis of pollutants.

In addition to the preceding provisions, the invention further comprises other provisions which will become apparent from the following description having reference to examples of embodiment of the method subject of the present invention.

It is to be understood however that these examples are solely illustrative of the subject of the invention and are in no way restrictive.

Example 1: Preparation of a Nanocomposite Comprising $TiO_2$ Nanoparticles Attached onto Carbon Nanostructures Preparatory Suspension:
Water is used as Dispersion Liquid
The preparatory suspension comprises:
Carbon nanotubes according to needs; the concentration thereof however must not exceed 5% by weight; 1% by weight of bile salt (sodium cholate and sodium deoxycholate).

Dispersion:
Ultrasonication treatment was applied for 50 minutes to the preparatory suspension using a 750 W ultrasound probe at 50% maximum power.

The morphological properties, chiefly the lengths and diameters of the carbon nanotubes after the ultrasonication dispersion step were verified by analysis under optical microscopy and electron transmission microscopy. The measurements also allowed observation of the homogeneity of the dispersion of nanotubes. Nanotubes were obtained having an average length of about 3 μm, the diameter being imposed on synthesis of the CNTs but not modified by ultrasonication treatment or acid attack.

Acid Attack
The previously dispersed nanotubes were treated in the preparatory suspension using a mixture of concentrated (pH<3) sulfuric acid (75% by volume) and nitric acid (25% by volume) in the ultrasound vessel at 50° C. for 2 hours. They were then filtered and re-dispersed for a few minutes under ultrasonication in toluene. Evidently, the ultrasonication treatment and chemical attack could advantageously be conducted simultaneously.

After this step, samples were taken for measurement to verify the formation of oxygenated bonds and to measure the quantity of added chemical functions. Analysis by infrared spectroscopy (IR) validated the presence of —CO groups ($1375\ cm^{-1}$) and —COO— groups ($1720\ cm^{-1}$) on the treated nanotubes, derived from acid treatment.

Stock Suspension:
After filtration, the nanotubes were placed in suspension in toluene and this suspension was mixed with a $TiO_2$ precursor, TTIP, in the following amounts:
  216.1 mg of carbon nanotubes
  385 g of TTIP
  26.1 g of toluene Laser Pyrolysis
The experimental conditions are given in Table 1 below.

TABLE 1

Main experimental characteristics: ρ is the ratio of the mass of nanotubes to foreseeable mass of $TiO_2$ assuming a yield of 100% for conversion of TTIP to $TiO_2$.

| | Reagent | | Entrainment | | Laser $CO_2$ | |
| --- | --- | --- | --- | --- | --- | --- |
| | Gas | Flow rate ($cm^3$/min) | Gas | Flow rate ($cm^3$/min) | Power (W) | ρ |
| $TiO_2$ alone | $C_2H_4$ | 355 | Ar | 2000 | 640 | 0% |
| Sample 1 | $C_2H_4$ | 355 | Ar | 2000 | 640 | 0.2% |
| Sample 2 | $C_2H_4$ | 355 | Ar | 2000 | 640 | 1% |

The gas flow rates were chosen to ensure the formation of a majority phase of anatase crystallographic structure in $TiO_2$ (in the order of 90%).

The selected sensitizing gas was ethylene ($C_2H_4$) since it efficiently absorbs laser radiation and promotes collisional transfer of energy to the growth reaction of $TiO_2$ from TTIP. In addition, on decomposing it does not contribute any additional heteroatom to the system (C and H are contained in TTIP). Other sensitizing gases could be propadiene, butadiene, acetylene, $SF_6$ ... either alone or in combination.

The flow is led into the reaction chamber via a nozzle which opens under the laser beam. The nozzle is itself contained in a concentric flue though which a stream of argon is passed which confines and isolates the reaction from the walls of the reaction chamber. The laser beam enters via a KCl window (transparent to the laser wavelength). The window is cooled by a fan and protected against possible deposits on its inner surface by flushing with argon It crosses orthogonally through the flow of reagents in the reaction chamber. The laser beam can be focused using a cylindrical or spherical lens placed on its optical pathway. The distance between the laser beam and the outlet of the precursor injection nozzle can be adjusted. The pressure inside the reaction chamber is regulated at a value in the order of atmospheric pressure. The nano-objects produced in the reaction chamber are entrained by pumping towards filtering barriers where they are collected by dry process.

The laser beam leaves the reaction chamber via a window identical to and placed opposite the inlet window. It is finally stopped by a power measurer of calorimeter type, and cooled by a water circuit. The power measurer allows the power of the laser beam in the reaction medium to be obtained before and during the reaction, and to infer therefrom the power absorbed during the reaction.

The $TiO_2$ nanoparticles germinate and grow when passed through the laser beam; it could be thought that they germinate directly on the surface of the carbon nanostructures with heterogeneous nucleation (evidently homogeneous nucleation of $TiO_2$ is always present and nanoparticles of $TiO_2$ are mostly obtained).

This method allows nanocomposites to be obtained having controlled morphology of small size, between 3 and 35 nm, and generally with narrow size distribution (10 to 15% around the mean) and having controlled crystallography. A black-coloured powder is obtained.

Heat Treatment:

Heat treatment is conducted in air to rid the nanocomposites of excess carbon due to decomposition of the $TiO_2$ precursor and/or of the sensitizing gas ($C_2H_4$).

The photo in FIG. 2 shows an example of a CNT coated with $TiO_2$ derived from Sample 1. The $TiO_2$ nanoparticles are solidly attached to an individual CNT: after several rinsing and centrifuging cycles, no change in the morphology of these objects is observed, these therefore being very stable.

Figure 3A:
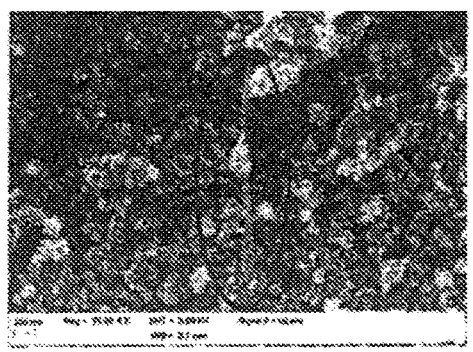
FIGS. 3a and 3b compare the morphology of CNT/TiO2 powders.
Figure 3B:
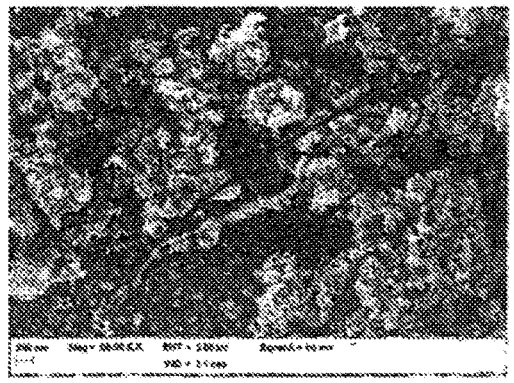

«In situ» CNT/$TiO_2$ nanocomposites, without prior acid treatment of the suspension of carbon nanotubes, were also synthesised according to the above-described method and compared with those obtained with prior acid treatment. FIG. 3 compares the morphology of CNT/$TiO_2$ powders: FIG. 3a corresponding to nanocomposites obtained without prior treatment of the CNT suspension via acid attack, and FIG. 3b corresponding to nanocomposites obtained with prior acid treatment. FIGS. 3a and 3b show that $TiO_2$ coating is better on the nanotubes previously treated in an acid medium.

Figure 4:
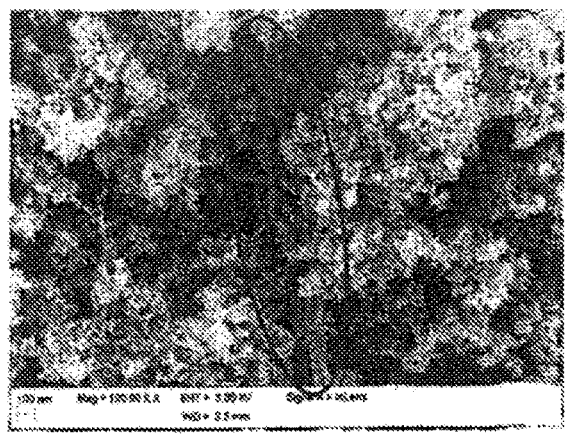
FIG. 4 is an image of an exemplary sample in accordance with embodiments described herein.

«In situ» nanocomposites of carbon nanotubes doped with nitrogen/$TiO_2$, without prior acid treatment of the suspension of carbon nanotubes, were also synthesised using this method. The electronic microscopy image clearly shows the «bamboo» structure typical of CNTs doped with nitrogen and coating thereof with $TiO_2$ particles (FIG. 4).

Example 2: Preparation of a Nanocomposite Comprising $TiO_2$ Particles Attached onto Sheets of Graphene Oxide The graphene oxide sheets were placed in suspension in toluene and ethanol and the suspension mixed with a $TiO_2$ precursor: TTIP. Typically, 560 mg of graphene oxide were dispersed in 30 ml of toluene or ethanol then added to 250 ml of TTIP solution (Samples G2, G3, Table 2). The graphene oxide sheets can also be prepared directly by ultrasonication, dispersed in the solution containing the $TiO_2$ precursor (Samples G4, G5, Table 2).

TABLE 2

| Samples | TTIP solution | Dispersion solvent (30 ml) | Mass of graphene oxide |
|---|---|---|---|
| $TiO_2$:G2 | 250 ml | Ethanol | 560 mg |
| $TiO_2$:G3 | 250 ml | Toluene | 560 mg |
| $TiO_2$:G4 | 250 ml | — | 190 mg |
| $TiO_2$:G5 | 250 ml | — | 56 mg |

The conditions for laser pyrolysis were identical to those in Example 1. The ratio of graphene oxide mass to foreseeable $TiO_2$ mass, assuming a yield of 100% for conversion of TTIP to $TiO_2$, was 0.9% by weight for samples G2 and G3, 0.3% by weight for sample G4 and 0.1% for sample G5.

With this method, it is possible to obtain nanocomposites having controlled morphology and controlled crystallography. A grey-coloured powder is obtained.

Heat Treatment:

Heat treatment was applied in air to rid the nanocomposites of excess carbon due to decomposition of the $TiO_2$ precursor and/or of the sensitizing gas ($C_2H_4$).

Figure 5:
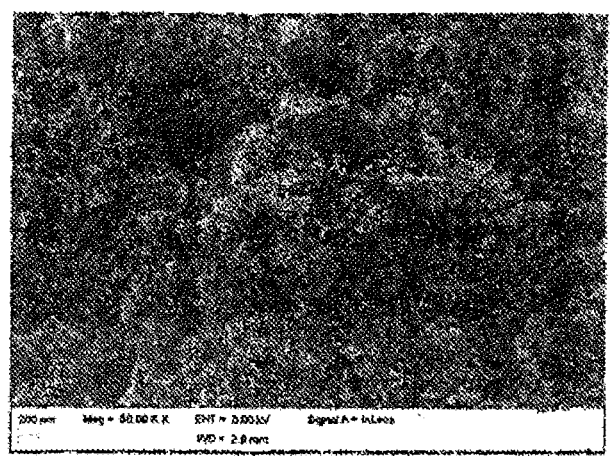
FIG. 5 is an image of an exemplary sample in accordance with embodiments described herein.

The photo in FIG. 5 shows an example of graphene oxide sheet coated with $TiO_2$ obtained using the method of the invention.

For all the samples (G2 to G5) quenching of photoluminescence intensity was observed, translating the efficacy of electron transfer of $TiO_2$ to graphene.

Example 3: Preparation of Porous Layers of Photovoltaic Cells

Cell with Photosensitive Pigment

The particles obtained ($TiO_2$ and nanocomposites of $TiO_2$ nanoparticles attached onto carbon nanostructures) were used to prepare porous layers of solar or photovoltaic cells.

These porous layers were integrated in a dye-sensitized solar cell configuration following the procedure described by Melhem using D102, D149H commercial dyes (H. Melhem, «Nouvelles électrodes poreuses de $TiO_2$ à base de nanocristaux synthétisés par pyrolyse laser pour cellules solaires sensibilisées à colorants à l'état solide», Thèse (November 2011) and «Direct photocurrent generation from nitrogen doped $TiO_2$ electrodes in solid-state dye-sensitized solar cells: towards optically-active metal oxides for photovoltaic applications», Solar Energy Materials and Solar Cells, 2013, 117, 624-631).

Table 3 below shows a very significant increase in the yield of a D102 dye-sensitized photovoltaic cell using nanocomposites corresponding to FIG. 2 (Sample 1). For comparison, the results obtained for a $TiO_2$ porous layer are also given in Table 3.

TABLE 3

Performance of two cells prepared under the same conditions
(with D102 dye) but using different CNT/TiO$_2$ composites.

| Composite | Open circuit voltage (V) | Short circuit current (mA/cm$^{-2}$) | Fill factor (FF) | Yield η |
|---|---|---|---|---|
| TiO$_2$ porous layer | 0.78 | 5.86 | 0.71 | 3.2 |
| Ex situ sample | 0.77 | 6.52 | 0.68 | 3.41 |
| Sample 1 | 0.76 | 7.78 | 0.70 | 4.13 |

Table 4 below summarises the performance obtained as a function of type of porous layer for cells prepared with the D149 dye. The cells were prepared under the same conditions.

TABLE 4

| Type of porous layer of D149 dye-sensitized photovoltaic cell | Open circuit voltage (V) | Short circuit current (mA/cm$^{-2}$) | Fill factor (FF) | Yield η |
|---|---|---|---|---|
| TiO$_2$ porous layer | 0.78 | 2.20 | 0.53 | 0.9 |
| « In situ » composite CNTs non-treated with acid/TiO$_2$ | 0.71 | 4.65 | 0.52 | 1.69 |
| « In situ » composite CNTs nitrogen-doped and non-treated with acid/TiO$_2$ | 0.79 | 4.04 | 0.58 | 1.84 |
| « In situ » composite CNTs treated with acid/TiO$_2$ | 0.79 | 4.65 | 0.57 | 2.08 |
| « In situ » composite graphene/TiO$_2$ | 0.81 | 3.21 | 0.62 | 1.61 |

It can be seen in this Table that i) all the cells containing CNT/Ti$_{O2}$ nanocomposites derived from the method of the invention have a higher yield than the yield obtained with a porous TiO$_2$ layer; ii) the yield of a photovoltaic cell is improved when the carbon nanotubes are previously treated by acid attack.

Example 4: Use of Nanocomposites Produced According to Example 1 for the Photocatalysis of Pollutants Photocatalytic Dissociation of a Polluting Model A 50 mg sample of a nanocomposite produced following the method of the invention was placed under agitation in 50 ml of formic acid. The suspension was left in the dark under agitation to reach chemical equilibrium and then exposed to light radiation; aliquots were regularly taken for measurement by high performance liquid chromatography (HPLC) of the amount of formic acid remaining in suspension as a function of radiation time.

Figure 6:
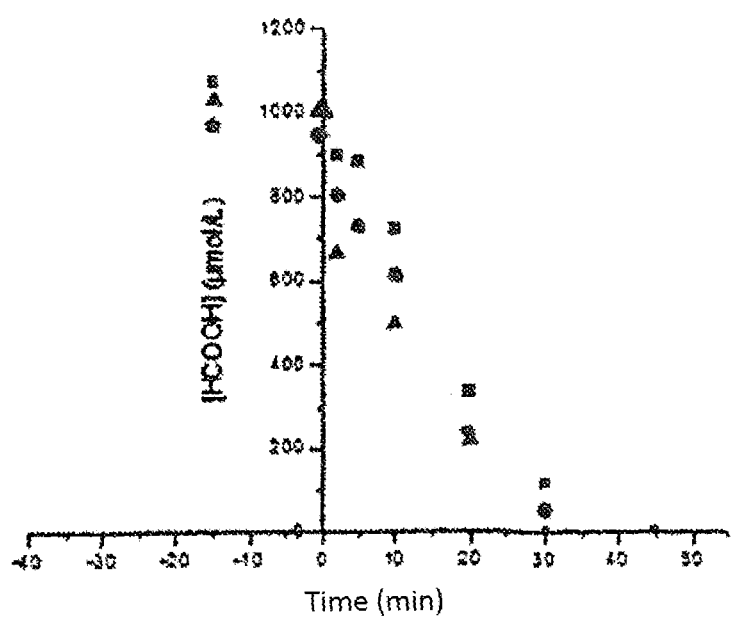
FIG. 6 graphically compares results obtained from samples in accordance with embodiments described herein compared to known materials.

FIG. 6 illustrates the results obtained with three types of samples:
- nanoparticles of TiO$_2$ alone (circles)
- control product (Evonik P25 powder) (squares)
- Sample 1 (triangles)

In FIG. 6, the time in minutes is given on the X-axis, and the formic acid concentration in μmoles/l is given along the Y-axis. The negative times correspond to the stabilisation phase in the dark.

The rate of formic acid dissociation measured when the sample consisted of TiO$_2$ nanoparticles alone (circles) is 34 micromoles per liter per minute. The dissociation rate measured with sample 1 is 46 micromoles per liter per minute. The composite produced with the method of the invention (triangles) is therefore more efficient than the TiO$_2$ nanoparticles alone or the control product displaying a dissociation rate of 29 micromoles per liter per minute (squares). A possible improvement can therefore also be seen in methods to treat pollutants by photocatalysis.

The invention claimed is:

1. A method to synthesize a nanocomposite compound comprising TiO$_2$ nanoparticles attached onto carbon nanostructures, characterized in that it comprises the following steps:
   i. Mixing carbon nanostructures and at least one TiO$_2$ precursor in a first liquid to form a stock suspension;
   ii. Nebulising and conveying said stock suspension via a gas flow into a reaction chamber;
   iii. Performing laser pyrolysis of said stock suspension in said reaction chamber simultaneously to form TiO$_2$ nanoparticles and to obtain grafting thereof on the nano structures.

2. The method according to claim 1, characterized in that the mixing step is preceded by the following steps:
   Adding carbon nanostructures to a dispersion liquid to form a preparatory suspension;
   Dispersing the carbon nanostructures in said preparatory suspension.

3. The method according to claim 2, characterized in that the dispersion step is conducted by applying ultrasonication to the preparatory suspension.

4. The method according to claim 2, characterized in that in addition the dispersion step comprises or is followed by an acid attack step of the nanostructures in the preparatory suspension so as to modify their surface condition.

5. The method according to claim 4, characterized in that the dispersion or an acid attack step is followed by steps of:
   Filtering the nanostructures for extraction thereof from the preparatory suspension;
   Adding the nanostructures to the first liquid.

6. The method according to claim 1, characterized in that at the nebulising step the stock suspension is entrained by a stream of entraining gas comprising a sensitizing gas.

7. The method according to claim 1, characterized in that the pyrolysis step is followed by the following steps:
   Dry collection of the nanocomposites produced in the reaction chamber;
   Application of heat treatment to said nanocomposites to remove excess carbon therefrom.

8. A photovoltaic cell porous layer, characterized in that it comprises nanocomposites produced according to the method of claim 1.

9. A photovoltaic cell, characterized in that it comprises a porous layer according to claim 8.

* * * * *